`US006008077A`

United States Patent [19]
Maeda

[11] Patent Number: 6,008,077
[45] Date of Patent: *Dec. 28, 1999

[54] METHOD FOR FABRICATING SEMICONDUCTOR DEVICE

[75] Inventor: Shigenobu Maeda, Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/030,956

[22] Filed: Feb. 26, 1998

[30] Foreign Application Priority Data

Aug. 22, 1997 [JP] Japan ..................................... 9-226289

[51] Int. Cl.$^6$ ......................... H01L 21/8234; H01L 21/84
[52] U.S. Cl. .......................... 438/151; 438/275; 438/592; 438/595; 438/682
[58] Field of Search .................................... 438/151, 275, 438/276, 279, 289, 291, 258, 592, 655, 682, FOR 216, FOR 218, 595, 153, 154; 148/DIG. 147, DIG. 150

[56] References Cited

U.S. PATENT DOCUMENTS

| | | | |
|---|---|---|---|
| 4,874,713 | 10/1989 | Gioia ....................................... | 438/231 |
| 5,021,853 | 6/1991 | Mistry .................................... | 257/357 |
| 5,262,344 | 11/1993 | Mistry .................................... | 438/275 |
| 5,543,338 | 8/1996 | Shimoji .................................. | 438/151 |
| 5,585,299 | 12/1996 | Hsu ........................................ | 438/275 |
| 5,589,423 | 12/1996 | White et al. ............................ | 437/228 |
| 5,672,527 | 9/1997 | Lee ......................................... | 438/275 |
| 5,814,537 | 9/1998 | Maa et al. ............................... | 438/151 |

FOREIGN PATENT DOCUMENTS 4-229649  8/1992  Japan .

OTHER PUBLICATIONS

T. Iwamatsu, et al., IEDM, vol. 93, pp. 475–478, "CAD–Compatible High–Speed CMOS/SIMOX Technology Using Field–Shield Isolation For 1M Gate Array", 1993.

T. Iwamatsu, et al., Extended Abstracts of the 1995 International Conference on Solid State Devices and Materials, pp. 575–577, "High–Speed 0.5μM SOI 1/8 Frequency Divider with Body–Fixed Structure for Wide Range of Applications", 1995.

S. Maeda, et al., IEDM, vol. 96, pp. 129–132, "Suppression of Delay Time Instability on Frequency Using Field Shield Isolation Technology for Deep Sub–Micron SOI Circuits", 1996.

Primary Examiner—Michael Trinh
Attorney, Agent, or Firm—Oblon, Spivak, McClelland, Maier & Neustadt, P.C.

[57] ABSTRACT

For a semiconductor device having a silicide protection film, provided is a semiconductor device fabrication method which prevents problems caused by overetching when forming the silicide protection film. A silicon oxide film (8) is formed all over the surface in a protection region (PR) and in an ordinary region (OR). Then N-type impurities are introduced by an ion implantation from above the silicon oxide film (8) through the silicon oxide film (8) to form a source/drain region (7) in a self-aligned manner in the surface of an SOI layer (3).

16 Claims, 11 Drawing Sheets

METHOD FOR FABRICATING SEMICONDUCTOR DEVICE

BACKGROUND OF THE INVENTION

1. Field of the Invention

The present invention relates to methods for fabricating semiconductor devices, and particularly to a method for fabricating a semiconductor device having silicide protection film.

2. Description of the Background Art

With transistors used for logic LSIs (Large-Scale Integrated Circuits), technology called salicide (self-aligned silicide) in which a silicide film is formed in a selective and self-aligned manner in the surface of a source/drain region and a polysilicon gate electrode in order to simultaneously reduce parasitic resistance of the source/drain region and interconnection resistance of the polysilicon gate electrode.

The salicide technology will now be described referring to FIG. 16 and FIG. 17.

First, as shown in FIG. 16, after formation of an MOS transistor M1 (in this case, N-channel type) on a silicon substrate SB, a metal film ML of cobalt (Co), for example, is formed by sputtering to a thickness of about 100 Å on the surface of the source/drain region SD, the exposed surface of the polysilicon gate electrode GE, and on the surface of the sidewall oxide film SW.

Next, a thermal treatment is performed under a temperature condition of 400 to 500° C. for 30 to 120 seconds to cause the part where the metal film MS and the silicon layer are in contact to react to form a silicide film. After that, the part remaining unreacted is removed by a wet etching and then a thermal treatment is applied under a temperature condition of 800 to 900° C. for 30 to 120 sec, so that a silicide film SF is formed only on the surface of the source/drain region SD and on the exposed surface of the polysilicon gate electrode GE, as shown in FIG. 17.

While the silicide film has the advantage of reducing the parasitic resistance and the interconnection resistance as stated above, the formation of the silicide film may bring about undesirable phenomena. In this case, as a countermeasure, a silicide protection film for preventing the formation of the silicide film is formed in the part where the formation of the silicide film is undesirable.

Next, a problem raised by the formation of the silicide film, and the silicide protection film will be described. First, FIG. 18 shows an inverter circuit C2 and a protection circuit C1 for protecting it as an example of a semiconductor integrated circuit.

The protection circuit C1 includes a P-channel MOS transistor P1 and an N-channel MOS transistor N1 connected in series, with an input pad PD connected to the node ND1 connecting the two transistors. The P-channel MOS transistor P1 has its gate electrode connected to the power-supply potential (Vcc) and it is always kept in an OFF state. The N-channel MOS transistor N1 has its gate electrode connected to the ground potential and it is always kept in an OFF state.

The inverter circuit C2 includes a P-channel MOS transistor P2 and an N-channel MOS transistor N2 connected in series, with the connection node ND2 between the two connected to another circuit not shown. The gate electrodes of the P-channel MOS transistor P2 and the N-channel MOS transistor N2 are connected to the node ND1 of the protection circuit C1.

Now, suppose that a surge voltage is inputted through the input pad PD, that is, that ESD (Electro Static Discharge) occurs. The surge voltage is much larger than the operating voltage of a common MOS transistor. In the absence of the protection circuit C1, the surge voltage will be applied to the gate electrodes of the P-channel MOS transistor P2 and the N-channel MOS transistor N2 of the inverter circuit C2 to possibly dielectric breakdown the gate insulation of the two. However, in the presence of the protection circuit C1, an application of the surge voltage causes the source/drain of the P-channel MOS transistor P1 and the N-channel MOS transistor N1 to break down to allow a current to flow, which prevents application of the surge voltage to the inverter circuit C2.

However, in the protection circuit C1, if an extremely large surge voltage is applied between the source and drain, the P-channel MOS transistor P1 or the N-channel MOS transistor N1 in the protection circuit C1 will destroy. The surge voltage at the time of destroy is called an ESD resistance, which is desirably set to a value as large as possible. However, if a silicide film is formed on the surface of the source/drain region, the ESD resistance voltage may be lowered.

FIG. 19 shows the structure of the MOS transistor M1 in a plane view. The MOS transistor M1 is formed of an elongate gate electrode GE provided in the center and a source/drain region SD on its both sides in the shorter direction, with a silicide film SF formed on the surface of the source/drain region SD.

FIG. 20 shows an enlarged view of the region A shown in FIG. 19. The silicide film SF generally has a polycrystal structure, which, as shown in FIG. 20, is formed of silicide crystal grains GR of various sizes. Accordingly, at grain boundaries, shapes of the individual grains are reflected to form undulations. The same is true at the edge portion of the silicide film SF along the edge portion of the gate electrode GE, and the crystal grains GR face each other with the gate electrode GE interposed therebetween, as shown in FIG. 20. When a surge voltage is applied to this structure, the surge current is concentrated to the part between protrusions of the crystal grains GR on both sides of the gate electrode GE (the part shown by the arrow) to intensively break that part, which deteriorates operation of the MOS transistor and destroys the function as a protection circuit. For this reason, a silicide film is not formed on the surface of the source/drain region in the protection circuit, and a silicide protection film is formed instead.

Next, referring to FIG. 21 and FIG. 22, the structure of an MOS transistor M2 having a silicide protection film will be described.

As shown in FIG. 21, a silicide protection film SP composed of a silicon oxide film ($SiO_2$) is formed on the surface of the gate electrode GE and on the surface of the source/drain region SD in the vicinity of the gate electrode GE. FIG. 22 shows the cross section along the line A—A shown in FIG. 21.

As shown in FIG. 22, the silicide protection film SP is formed on the surface of the gate electrode GE and the sidewall oxide film SW, and on the surface of the source/drain region SD in the vicinity of the gate electrode GE, with no silicide film SF formed on the top of the silicide protection film SP. This structure enlarges the distance between the edge portions of the silicide film SF and the edge portions of the gate electrode GE. Hence, even if the edge portions of the silicide film SF are shaped in the form of continuous irregularities and the surge current is concentrated to protruding parts, the surge current passes through the highly resistive source/drain region SD and lightly-doped drain region LD so that the voltage is lowered. Furthermore, it diffuses since it travels in a long distance in the source/drain region SD and the lightly-doped drain region LD, so that the MOS transistor is prevented from destroy.

As described above, in MOS transistors in which formation of a silicide film SF causes troubles, a silicide protection film SP is formed to prevent the formation of the silicide film SF.

When forming the silicide protection film SP, a silicon oxide film is formed all over the surface of the silicon substrate SB and then the silicon oxide film is selectively removed by a dry etching to form the silicide protection film SP only on the surface of the gate electrode GE and the source/drain region SD in the vicinity of the gate electrode GE.

Accordingly, the surface of the silicon substrate SB is exposed not only to etching for formation of the sidewall oxide film SW of the MOS transistor but also to etching for formation of the silicide protection film SP. When an MOS transistor is formed on a bulk silicon substrate, removing the substrate surface to some extent with an increased number of etching processes causes no serious problem. However, when an MOS transistor is formed on an SOI substrate having a semiconductor layer formed in the form of a film on an insulating substrate, specifically an SOI (semiconductor-on-isolation) layer, the increased number of etching processes causes a serious problem.

FIG. 23 shows a structure in which a silicide protection film is formed on an MOS transistor M3 formed on an SOI substrate.

In FIG. 23, the SOI substrate SI includes a buried insulating layer BO formed on a silicon substrate SB and an SOI layer SL formed on the buried insulating layer BO. The MOS transistor M3 is formed on the SOI layer SL. Generally, the SOI layer SL is so thin that the influence of overetching cannot be neglected.

For example, FIG. 23 shows a step D1 at the edge portion of the sidewall oxide film SW, which is formed by overetching when the sidewall oxide film SW is formed. The thickness of the SOI layer SL is reduced by the height of the step D1. At the edge portion of the silicide protection film SP, a step D2 is formed by overetching when forming the silicide protection film SP, which reduces the thickness of the SOI layer SL by its height. Thus the two times of overetching largely reduces the thickness of the SOI layer SL in the part uncovered by the silicide protection film SP. If a silicide film SF is formed in that part, the remaining SOI layer SL may all become the silicide film SF. In a part where the SOI layer SL is all formed of the silicide film SF, the inferior adhesion between the buried insulating layer BO ($SiO_2$ layer) and the silicide film SF causes the silicide film SF to exfoliate to form conductive dust. If the conductive dust remains on the semiconductor device, it will adversely affect the operating characteristics of the semiconductor device. If the part to become a source/drain region becomes the silicide film SF and exfoliate, the original functions of the semiconductor device cannot be obtained.

SUMMARY OF THE INVENTION

A first aspect of the present invention is directed to a method for fabricating a semiconductor device comprising first and second MOS transistors formed on a semiconductor substrate, with a silicide protection film formed in a part where formation of a silicide film is not desirable in the first MOS transistor. According to the present invention, the semiconductor device fabrication method comprises the steps of: (a) forming a first gate oxide film and a first gate electrode one on top of the other in this order in a region in which the first MOS transistor is formed on a main surface of the semiconductor substrate and a second gate oxide film and a second gate electrode one on top of the other in this order in a region in which the second MOS transistor is formed; (b) implanting impurity ions of a first conductivity type into the semiconductor substrate by using the first and second gate electrodes as masks to form a first semiconductor region of the first conductivity type at a relatively low concentration in a self-aligned manner in the surface of the semiconductor substrate on the outside of side surfaces of the first and second gate electrodes; (c) forming an oxide film to cover the first and second gate electrodes and the surface of the semiconductor substrate; (d) implanting impurity ions of the first conductivity type from above the oxide film by using the first and second gate electrodes and the oxide film formed on the side surfaces of the first and second gate electrodes as masks to form a second semiconductor region of the first conductivity type at a relatively high concentration in a self-aligned manner in the surface of the semiconductor substrate including the first semiconductor region; (e) selectively forming a resist mask extending from the top of the first gate electrode to the top of said oxide film of the outer vicinity of the side surface of the first gate electrode; and (f) etching the oxide film uncovered by the resist mask such that the oxide film under the resist mask is left as the silicide protection film and that the oxide film on the side surfaces of the second gate electrode and the second gate oxide film is left as a sidewall oxide film.

Preferably, according to a second aspect, the step (f) comprises the steps of (f-1) thinning the thickness of the oxide film uncovered by the resist mask by anisotropic dry etching, and (f-2) removing the thinned oxide film by wet etching.

A third aspect of the present invention is directed to a method for fabricating a semiconductor device having first and second MOS transistors formed on a semiconductor substrate with a silicide protection film formed in a part where formation of a silicide film is undesirable in the first MOS transistor. The semiconductor device fabrication method comprises the steps of: (a) forming a first gate oxide film and a first gate electrode one on top of the other in this order in a region in which the first MOS transistor is formed on a main surface of the semiconductor substrate and a second gate oxide film and a second gate electrode one on top of the other in this order in a region in which the second MOS transistor is formed; (b) implanting impurity ions of a first conductivity type into the semiconductor substrate by using the first and second gate electrodes as masks to form a first semiconductor region of the first conductivity type at a relatively low concentration in a self-aligned manner in the surface of the semiconductor substrate on the outside of side surfaces of the first and second gate electrodes; (c) forming a first oxide film to cover the first and second gate electrodes and the surface of the semiconductor substrate; (d) thinning the thickness of the first oxide film by anisotropic dry etching to form a first sidewall oxide film on the side surfaces of the first gate electrode and the first gate oxide film and to form a second sidewall oxide film on the side surfaces of the second gate electrode and the second gate oxide film; (e) before or after the step (d), implanting impurity ions of the first conductivity type from above the first oxide film to form a second semiconductor region of the first conductivity type at a relatively high concentration in a self-aligned manner in the surface of the semiconductor substrate including the first semiconductor region; (f) forming a second oxide film on the thinned first oxide film; (g) selectively forming a resist mask extending from the top of the first gate electrode to the top of said second oxide film of the outer vicinity of the side surface of the first gate electrode; and (h) removing the second oxide film uncovered by the resist mask and the thinned first oxide film under said second oxide film by etching and making the second oxide film under the resist mask the silicide protection film.

Preferably, according to a fourth aspect, the step (e) is performed prior to the step (d), and the step (e) comprises the step of implanting impurity ions of the first conductivity type by using the first and second gate electrodes and the first oxide film formed on the side surfaces of the first and second gate electrodes as masks.

Preferably, according to a fifth aspect, the step (e) is performed after the step (d), and the step (e) comprises the step of implanting impurity ions of the first conductivity type by using the first and second gate electrodes and the first and second sidewall oxide films as masks.

Preferably, according to a sixth aspect, the step (h) comprises the steps of (h-1) thinning the thickness of the second oxide film at least in the part uncovered by said resist mask by anisotropic dry etching at least in the part uncovered by the resist mask, and (h-2) removing the thinned second oxide film and the thinned first oxide film under the second oxide film by wet etching.

Preferably, according to a seventh aspect, the semiconductor substrate is an SOI substrate comprising an SOI layer formed on an insulating substrate.

According to the semiconductor device fabrication method of the first aspect of the present invention, a silicide protection film and an oxide film for allowing the first semiconductor region to be left as a lightly-doped drain region are formed by applying a single etching process to an oxide film formed in common and a second semiconductor region forming a source/drain region is formed by an ion implantation through the oxide film. This simplifies the fabrication process and reduces the fabrication cost, and also reduces the number of times that the surface of the semiconductor substrate is removed by overetching. This prevents the thickness of the second semiconductor region existing in the semiconductor substrate surface in the vicinities of the edge portions of the silicide protection film and the sidewall oxide film from being excessively reduced, thus providing a semiconductor device which prevents occurrence of troubles due to the reduction in the thickness of the second semiconductor region. Furthermore, performing the impurity implantation through the oxide film prevents the surface of the semiconductor substrate from being damaged by the implantation.

According to the semiconductor device fabrication method of the second aspect of the present invention, the oxide film with a reduced thickness is removed by wet etching having a high selectivity ratio with respect to the semiconductor substrate material, so that the rate of overetching to the surface of the semiconductor substrate is small. This further prevents the excessive reduction in the thickness of the second semiconductor region in the semiconductor substrate surface in the vicinities of the edge portions of the silicide protection film and the sidewall oxide film.

According to the semiconductor device fabrication method of the third aspect of the present invention, although the first oxide film for allowing the first semiconductor region to remain as a lightly-doped drain region and the silicide protection film are formed in separated process steps, the surface of the semiconductor substrate is subject to etching only once. This reduces the number of times that the surface of the semiconductor substrate is removed by overetching, which prevents excessive reduction in the thickness of the semiconductor substrate. This prevents excessive reduction in the thickness of the second semiconductor region existing in the semiconductor substrate surface in the vicinities of the edge portions of the silicide protection film and the first and second sidewall oxide films, thus providing a semiconductor device which prevents occurrence of troubles due to the reduction in the thickness of the second semiconductor region. Furthermore, performing the impurity implantation through the first oxide film prevents damage by the implantation to the surface of the semiconductor substrate. Moreover, forming the first oxide film for allowing the first semiconductor region to remain as a lightly-doped drain region and the silicide protection film in separated process steps provides a fabrication method suitable for a semiconductor device in which the two films have different thicknesses.

According to the semiconductor device fabrication method of the fourth aspect of the present invention, since no impurity ions of the first conductivity type are implanted into the first semiconductor region located under the first oxide film formed on the sides of the first and second gate electrodes, the region forms a lightly-doped drain region. The impurity ions of the first conductivity type are additionally implanted into the remaining part of the first semiconductor region to form a source/drain region.

According to the semiconductor device fabrication method of the fifth aspect of the present invention, no impurity ions of the first conductivity type are implanted into the first semiconductor region located under the first and second sidewall oxide films, so that the region forms a lightly-doped drain region. The impurity ions of the first conductivity type are additionally implanted into the remaining part of the first semiconductor region to form a source/drain region. Further, implanting the impurity ions of the first conductivity type into the first semiconductor region through the first oxide film with a thinned thickness allows use of lower implant energy.

According to the semiconductor device fabrication method of the sixth aspect of the present invention, the second oxide film with a reduced thickness and the first oxide film with a reduced thickness under it are removed by wet etching having a high selectivity ratio with respect to the semiconductor substrate material, so that the rate of overetching to the surface of the semiconductor substrate is small. This further prevents the excessive reduction in the thickness of the second semiconductor region in the semiconductor substrate surface in the vicinities of the edge portions of the silicide protection film and the sidewall oxide film.

According to the semiconductor device fabrication method of the seventh aspect of the present invention, excessive reduction in the thickness of the SOI layer is prevented in a semiconductor device having first and second MOS transistors formed on an SOI substrate. The possibility that the SOI layer all becomes a silicide film in the silicide process is therefore reduced. This prevents the phenomenon in which the silicide film exfoliate to form conductive dust, which prevents deterioration of the operating characteristics of the semiconductor device due to the presence of the conductive dust, and which also prevents deterioration of functions as a semiconductor device caused when the silicide film comes off.

The present invention has been made to solve the problems stated above, and it is an object of the invention to provide a fabrication method for a semiconductor device having a silicide protection film which prevents problems caused by overetching in formation of the silicide protection film.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment
<A-1. Fabrication Method>

For a first preferred embodiment of the present invention, a method for fabricating a semiconductor device 100 having an MOS transistor which requires a silicide protection film will now be described referring to FIGS. 1 to 5 showing the fabrication process in the order.

Figure 1:
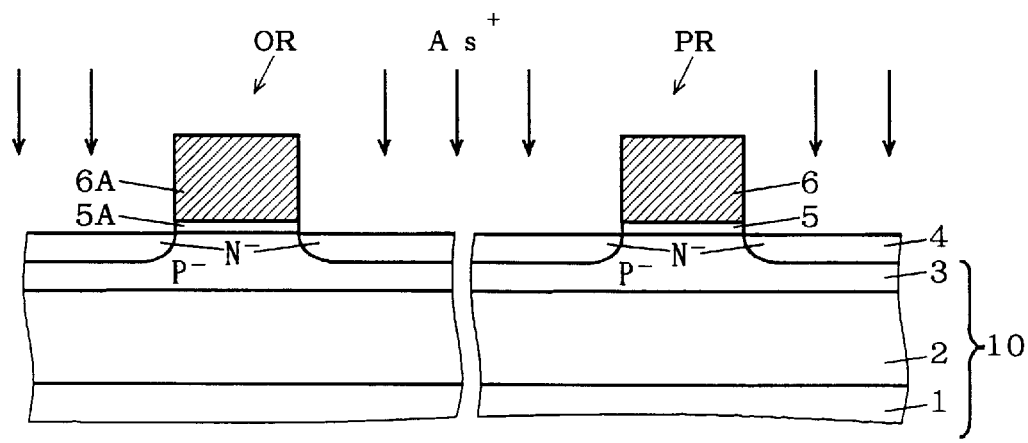
FIGS. 1 to 5 are diagrams showing a method for fabricating a semiconductor device according to a first preferred embodiment of the present invention.

First, in the process step shown in FIG. 1, an SOI substrate 10 is prepared, in which a buried insulating layer 2 and an SOI layer 3 are sequentially formed on a silicon substrate 1. Next, gate oxide films 5 and 5A and gate electrodes 6 and 6A are selectively formed in the protection region PR in which an MOS transistor requiring a silicide protection film is formed and in the ordinary region OR in which an MOS transistor requiring no silicide protection film is formed, respectively. Then N-type impurities (e.g., As) are introduced by an ion implantation into the SOI layer 3 by using the gate electrodes 6 and 6A as masks to form a lightly-doped drain region 4 (a first semiconductor region) in a self-aligned manner in the surface of the SOI layer 3. The SOI layer 3 contains P-type impurities previously introduced at a relatively low concentration.

Figure 2:
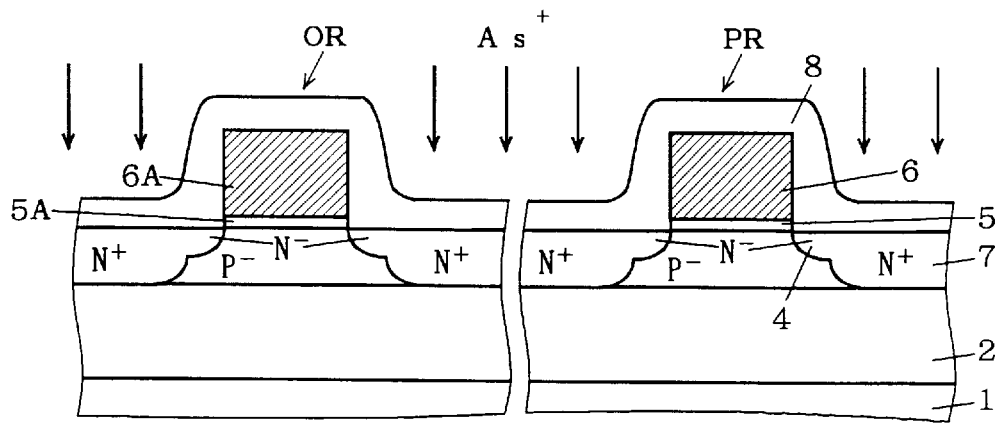

Next, in the process step shown in FIG. 2, a silicon oxide film 8 is formed all over the protection region PR and the ordinary region OR. Then N-type impurities (e.g., As) are introduced by an ion implantation from above the silicon oxide film 8 through the silicon oxide film 8 to form a source/drain region 7 (a second semiconductor region) in a self-aligned manner in the surface of the SOI layer 3.

It is necessary to pay attention to the thickness of the gate electrodes 6 and 6A and the thickness of the silicon oxide film 8 so that the impurities are not implanted into the SOI layer 3 under the gate electrodes 6 and 6A and into the part where the lightly-doped drain region 4 should remain. When arsenic (As) is used as the impurities, for example, and the implant energy is 80 keV, then the thickness of the gate electrodes 6 and 6A is set to be about 2000 Å and the thickness of the silicon oxide film 8 is set to be about 500 Å.

With these thicknesses, if boron fluoride ($BF_2$) is used as impurities (when forming a P-type MOS transistor), the implant energy is about 60 keV.

Thus applying an ion implantation through the silicon oxide film 8 prevents the surface of the SOI layer 3 from being damaged by the implantation.

Figure 3:
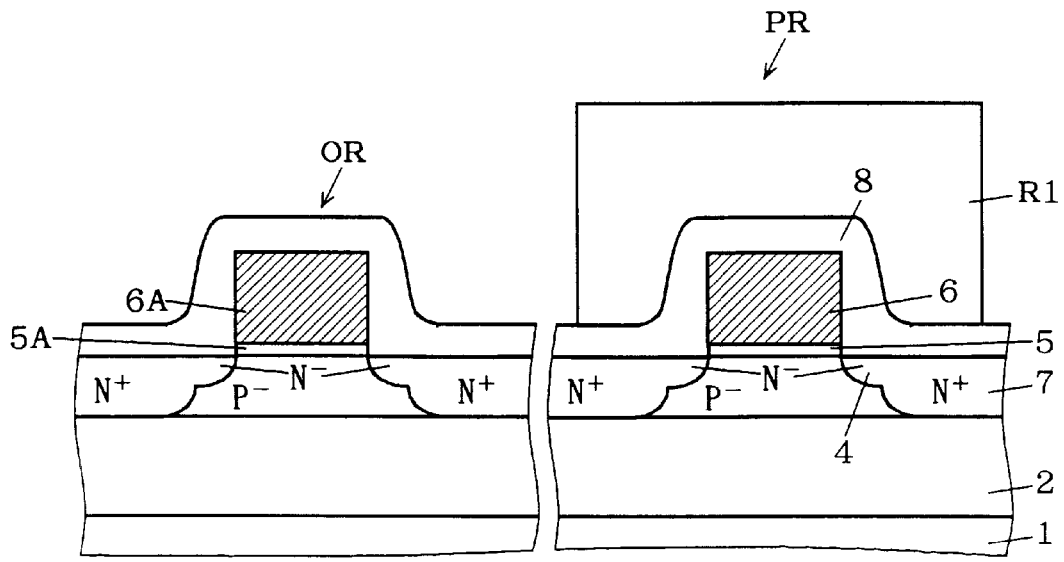

Next, in the process step shown in FIG. 3, a resist mask R1 is selectively formed on a predetermined portion of the silicon oxide film 8 in the protection region PR. The resist mask R1 is formed to cover the part where the silicon oxide film 8 should be left as a silicide protection film. In FIG. 3, it is formed over the gate electrode 6 and part of the source/drain region 7 in the vicinity of the gate electrode 6.

Figure 4:
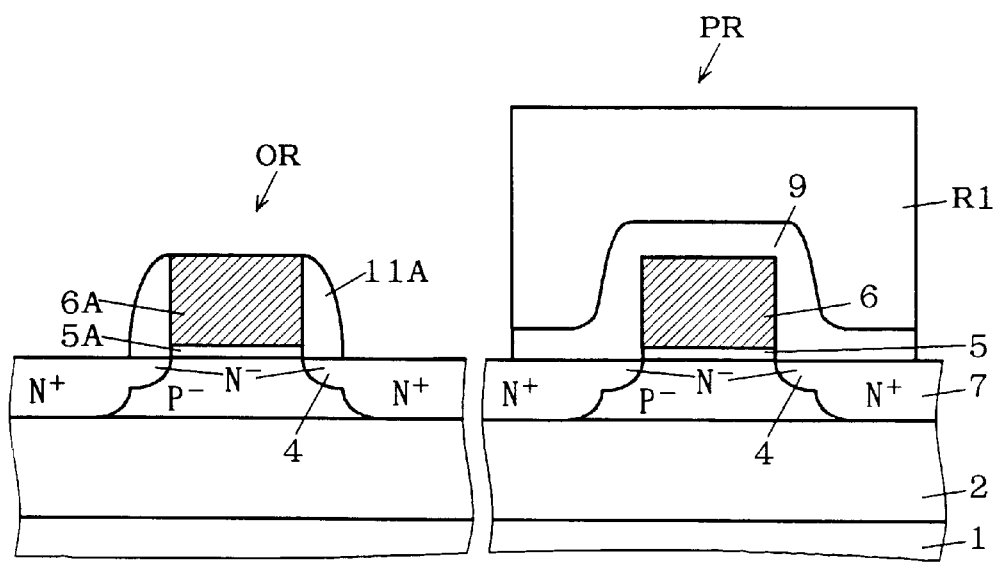

Next, in the process step shown in FIG. 4, the silicon oxide film 8 is removed by a dry etching except in the part covered by the resist mask R1. In this process step, a silicide protection film 9 is formed over the gate electrode 6 and the source/drain region 7 in the vicinity of the gate electrode 6 and a sidewall oxide film 11A is formed on both sides of the gate electrode 6A and the gate oxide film 5A.

Figure 5:
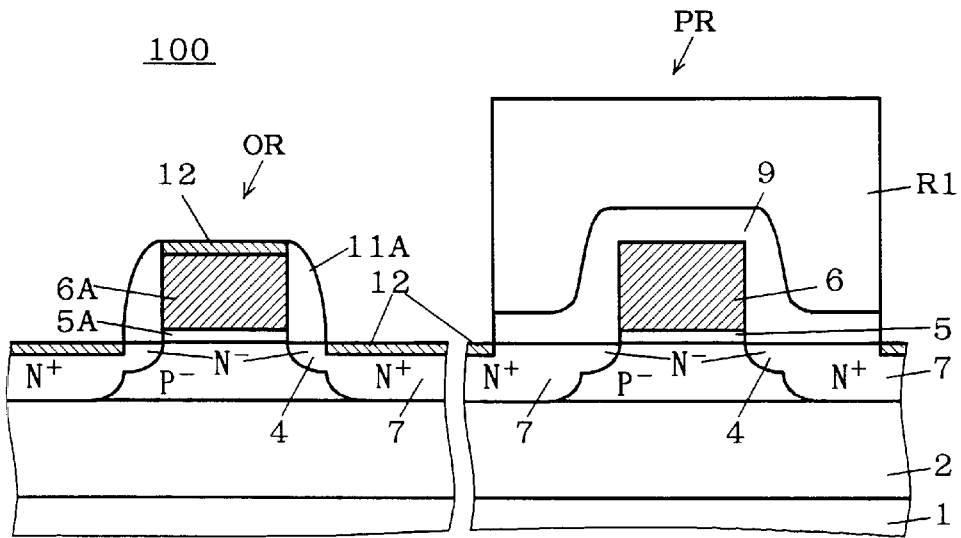

Next, after removal of the resist mask R1, a metal film, e.g., cobalt (Co), is formed all over the surface by sputtering to a thickness of about 100 Å. Next, a thermal treatment is applied under a temperature condition of 400 to 500° C. for 30 to 120 sec to cause the part where the metal film and the silicon layer are in contact to react to form a silicide film. Subsequently, the part remaining unreacted is removed by a wet etching, and a thermal treatment is performed under a temperature condition of 800 to 900° C. for 30 to 120 sec to obtain the semiconductor device 100 having a silicide film 12 formed in a self-aligned manner only on the exposed surface of the source/drain region 7 and on the exposed surface of the gate electrode 6A, as shown in FIG. 5.

The silicide film 12 may be formed of any silicide, such as titanium silicide ($TiSi_2$), nickel silicide ($NiSi_2$), tungsten silicide ($WSi_2$), etc.

<A-2. Characteristic Functions and Effects>

According to the first preferred embodiment of the present invention, as has been explained above, the silicide protection film 9 in the protection region PR and the sidewall oxide film 11A in the ordinary region are formed by applying a single etching process to the silicon oxide film 8 formed in common. This reduces the number of times that the surface of the SOI layer 3 is removed by overetching to prevent the thickness of the SOI layer 3 from excessively decreasing, which reduces the possibility that the SOI layer 3 all becomes a silicide film in the silicide process. This avoids the phenomenon in which the silicide film 12 exfoliate to form conductive dust, which prevents the operating characteristics of the semiconductor device from being deteriorated by the presence of the conductive dust, and which also prevents the functions of the semiconductor device from being deteriorated due to exfoliation of the silicide film 12. Furthermore, since the source/drain implantation is performed through the silicon oxide film 8, the surface of the SOI layer 3 is protected from damage caused by the implantation.

Forming the silicide protection film 9 and the sidewall oxide film 11A from the common silicon oxide film 8 and performing source/drain implantation through the silicon oxide film 8 also provide the effect of simplifying the fabrication process, in addition to the functions and effects described above.

For example, U.S. Pat. No. 5,585,299 shows a structure in which a silicide protection film and a sidewall oxide film are formed from a common silicon oxide film. However, according to this reference, source/drain implantation into the protection region is performed after the silicide protection film is completely removed from the top of the MOS transistor in the protection region after the salicide process is finished. This requires the technically difficult process of completely removing the silicide protection film. This complicates the fabrication process and damages the source/drain region surface by overetching. In contrast, in this invention, such a problem is not encountered because it is not necessary to remove the silicide protection film from the top of the MOS transistor in the protection region.

It is not sufficient to perform only a dry etching to completely remove the silicide protection film including that on the sides of the gate electrode. This requires a wet etching, and that a wet etching in a relatively long time. However, applying a wet etching for a long time may also remove the gate oxide film of the MOS transistor to break the MOS transistor. The present invention is free from such a problem.

U.S. Pat. No. 5,262,344 and No. 5,021,853 show a structure in which a silicide protection film and a sidewall oxide film are formed from a common silicon oxide film. However, source/drain implantation is done by an ion implantation by using the gate electrode as a mask before forming the silicon oxide film. This cannot prevent damage caused by the implantation into the substrate surface. Further, unlike the present invention, the source/drain region is formed by using the gate electrode as a mask, without forming a lightly-doped drain region.

<A-3. Modification>

The first preferred embodiment of the present invention described above has shown an example in which the resist mask R1 is selectively formed on a certain part of the silicon oxide film 8 in the protection region PR in the process step shown in FIG. 3 and then the silicon oxide film 8 is removed except in the part covered by the resist mask R1 by a dry etching in the process step shown in FIG. 4. However, in view of preventing the surface of the SOI layer 3 from being overetched, the following method can be adopted.

Figure 6:
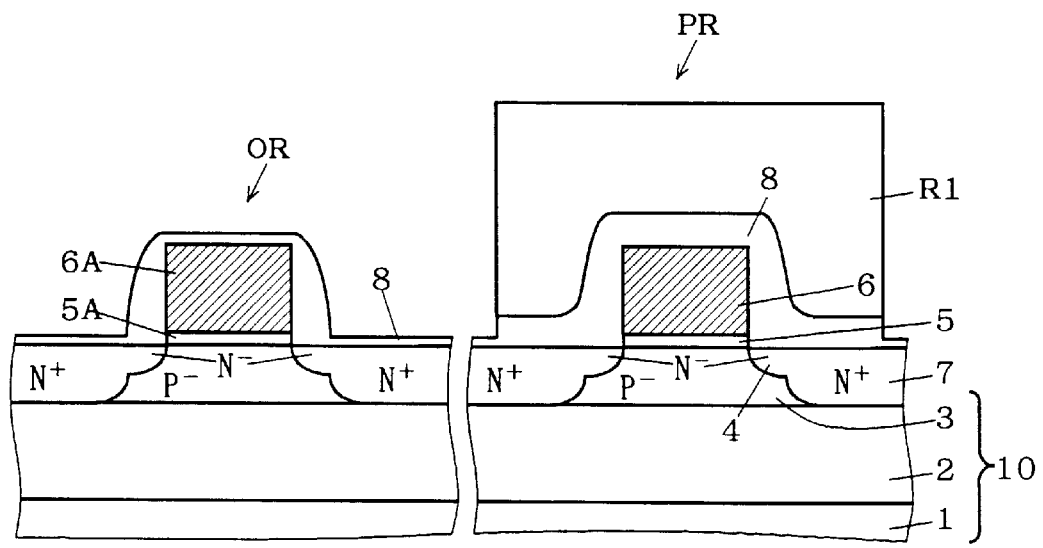
FIGS. 6 and 7 are diagrams showing a modification of the semiconductor device fabrication method of the first preferred embodiment of the present invention.

That is to say, following the process step shown in FIG. 3, the silicon oxide film 8 is removed to a certain thickness except in the part covered by the resist mask R1 by a dry etching as shown in FIG. 6. In this case, the silicon oxide film 8 is set to a thickness of about 200 Å on the SOI layer 3.

Figure 7:
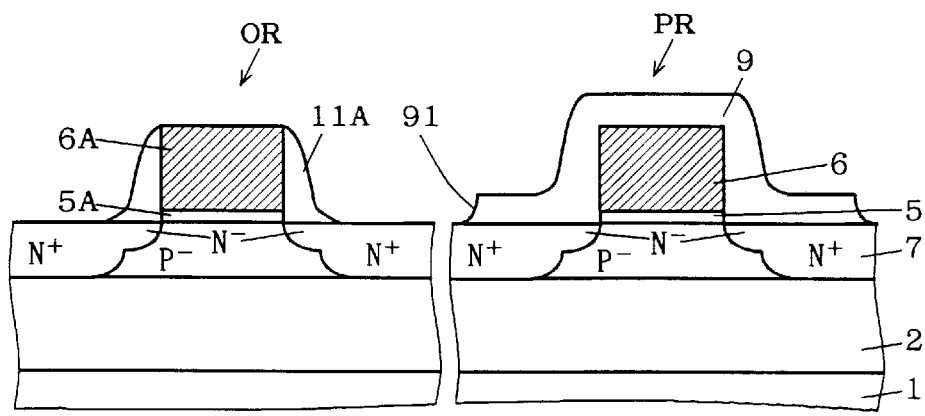

Next, in the process step shown in FIG. 7, the remaining silicon oxide film 8 is completely removed by a wet etching. Since the wet etching has a high selectivity ratio with respect to silicon, the rate of overetch on the surface of the SOI layer 3 is small, which further prevents the excessive reduction in the thickness of the SOI layer 3. This further reduces the possibility that the SOI layer 3 all becomes a silicide film in the silicide process.

Since wet etching is isotropic, the silicide protection film 9 is somewhat removed in the part uncovered by the resist mask R1, i.e., the edge portion 91, and therefore the surface of the edge portion 91 is gradually sloped in the vertical section direction. The same is true for the surface form of the sidewall oxide film 11A in the MOS transistor in the ordinary region OR. It can be said that this is a feature of an application of this modification.

B. Second Preferred Embodiment

<B-1. Fabrication Method>

The first preferred embodiment described referring to FIG. 1 to FIG. 5 has shown an example in which the silicide protection film 9 and the sidewall oxide film 11A are formed from the common silicon oxide film 8 and a source/drain implantation is done through the silicon oxide film 8. In view of reducing the number of times of overetching, the following fabrication method described referring to FIG. 8 to FIG. 13 may be adopted.

Figure 8:
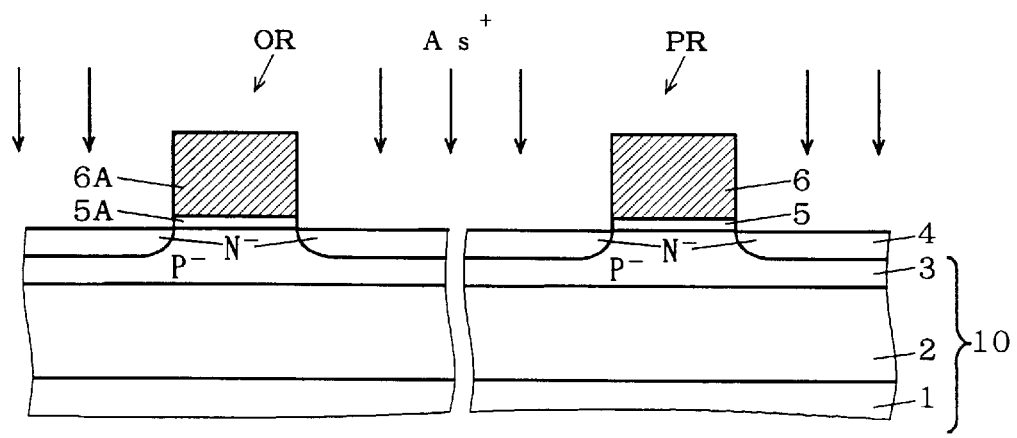
FIGS. 8 to 13 are diagrams showing a method for fabricating a semiconductor device according to a second preferred embodiment of the present invention.

First, in the process step shown in FIG. 8, the SOI substrate 10 is prepared in which the buried insulating layer 2 and the SOI layer 3 are successively formed on the silicon substrate 1. Then the gate oxide films 5 and 5A and the gate electrodes 6 and 6A are selectively formed respectively in the protection region PR in which an MOS transistor requiring a silicide protection film is formed and in the ordinary region OR in which an MOS transistor requiring no silicide protection film is formed, and N-type impurities (e.g., As) are introduced by an ion implantation into the SOI layer 3 by using the gate electrodes 6 and 6A as masks to form the lightly-doped drain region 4 (the first semiconductor region) in a self-aligned manner in the surface of the SOI layer 3. The SOI layer 3 contains P-type impurities introduced at a relatively low concentration.

Figure 9:
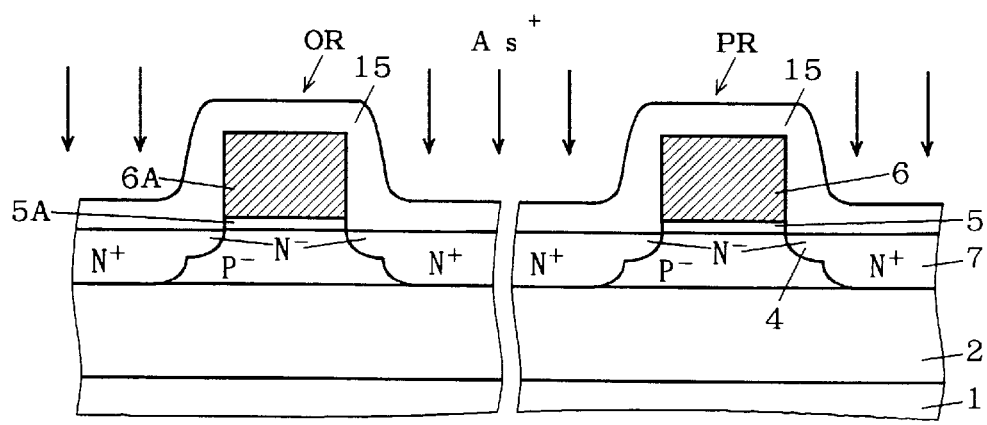

Next, in the process step shown in FIG. 9, a silicon oxide film 15 (a first silicon oxide film) is formed all over the protection region PR and the ordinary region OR. Then N-type impurities (e.g., As) are introduced from above the silicon oxide film 15 through the silicon oxide film 15 by an ion implantation to form the source/drain region 7 (the second semiconductor region) in a self-aligned manner in the surface of the SOI layer 3.

It is necessary to pay attention to the thickness of the gate electrodes 6 and 6A and the thickness of the silicon oxide film 15 so that impurities are not implanted into the SOI layer 3 under the gate electrodes 6 and 6A and into the part where the lightly-doped drain region 4 should remain. When arsenic (As) is used as the impurities, for example, and the implant energy is 80 keV, then the thickness of the gate electrodes 6 and 6A is set to be about 2000 Å, and the thickness of the silicon oxide film 15 is set to be about 500 Å.

With these thicknesses, if boron fluoride ($BF_2$) is used as impurities (when forming a P-type MOS transistor), the implant energy is about 60 keV.

Thus applying an ion implantation through the silicon oxide film 15 prevents damage by the implantation to the surface of the SOI layer 3.

Figure 10:
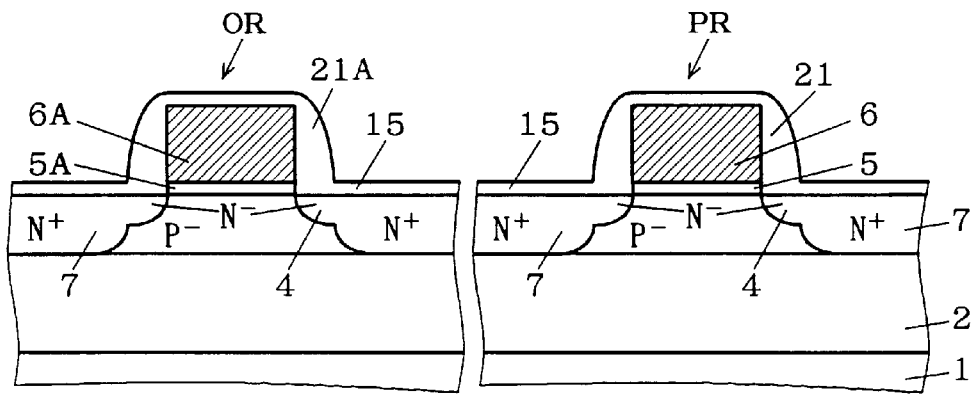

Next, as shown in FIG. 10, the silicon oxide film 15 is removed to a certain thickness by a dry etching. In this case, the thickness of the silicon oxide film 15 is set to be about 200 Å on the SOI layer 3. This process step forms a sidewall oxide film 21A on both sides of the gate electrode 6A and the gate oxide film 5A and a sidewall oxide film 21 on both sides of the gate electrode 6 and the gate oxide film 5. The silicon oxide film 15 is left with a thickness of 200 Å on the top surfaces of the gate electrodes 6 and 6A.

Figure 11:
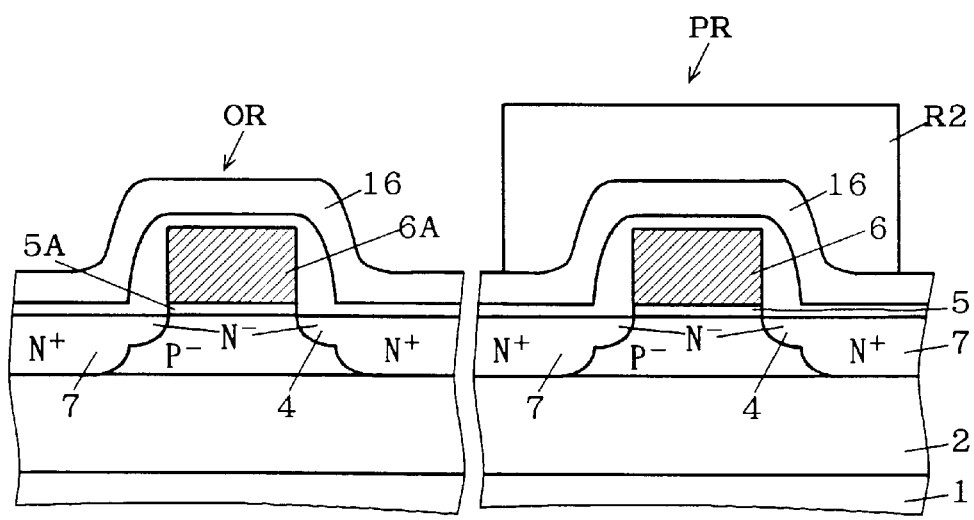

Next, in the process step shown in FIG. 11, a silicon oxide film 16 (a second silicon oxide film) is formed all over the surface and a resist mask R2 is selectively formed on a certain part of the silicon oxide film 16 in the protection region PR. The thickness of the silicon oxide film 16 is about 1000 Å, for example.

The resist mask R2 is formed to cover the silicon oxide film 16 in the part where it should be left as a silicide protection film. In FIG. 11, it is formed over the gate electrode 6 and the source/drain region 7 in the vicinity of the gate electrode 6.

Figure 12:
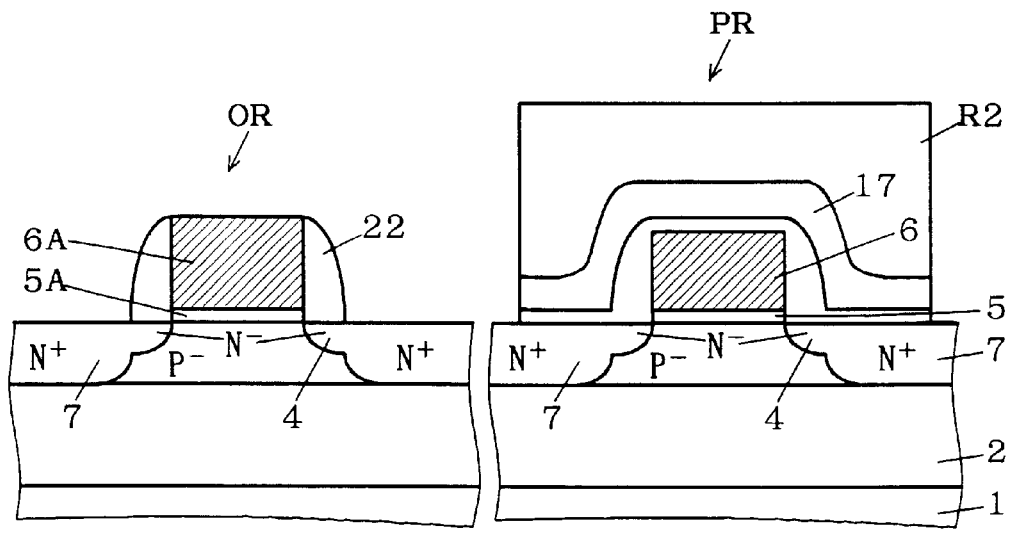

Next, in the process step shown in FIG. 12, the silicon oxide film 16 and the silicon oxide film 15 under it are removed by a dry etching except in the part covered by the resist mask R2. This process forms a silicide protection film 17 over the gate electrode 6 and the source/drain region 7 in the vicinity of the gate electrode 6 and a sidewall oxide film 22 on both sides of the gate electrode 6A and the gate oxide film 5A.

Figure 13:
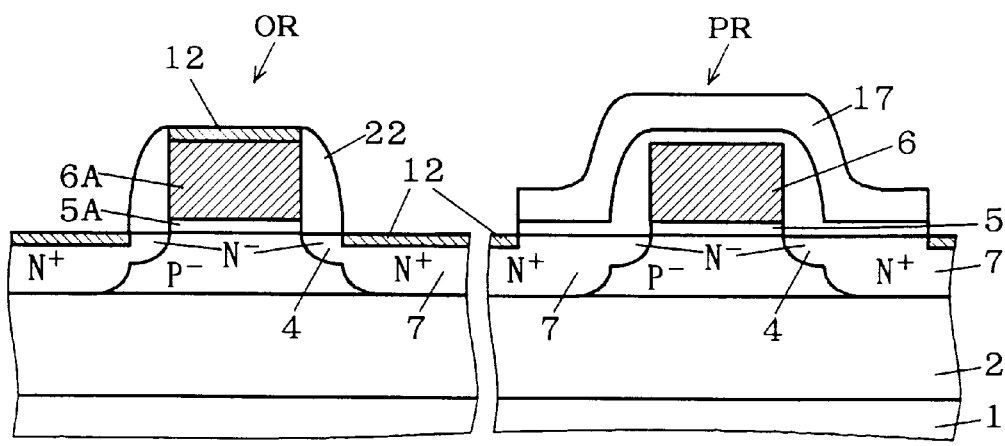

Next, after removal of the resist mask R2, in the process step shown in FIG. 13, a silicide film 12, e.g., a cobalt silicide, is formed in a self-aligned manner only on the exposed surface of the source/drain region 7 and on the exposed surface of the gate electrode 6A by salicide technology to obtain a semiconductor device 200. The silicide film 12 is formed by the same method as that in the first preferred embodiment, which is not repeatedly described again.

Although the description above has shown an example in which an ion implantation is done from above the silicon oxide film 15 in the process step shown in FIG. 9 to form the source/drain region 7, the source/drain implantation may be done in the process step shown in FIG. 10.

That is to say, after the silicon oxide film 15 is removed to a certain thickness by a dry etching, the source/drain implantation may be applied through the thinned silicon oxide film 15. In this case, since the sidewall oxide film 21A is formed on both sides of the gate electrode 6A and the gate oxide film 5A and the sidewall oxide film 21 is formed on both sides of the gate electrode 6 and the gate oxide film 5, N-type impurities are not additionally implanted under the sidewall oxide films 21 and 21A, which allows the lightly-doped drain region 4 to be left.

Since the silicon oxide film 15 has a thickness of about 200 Å, the implant energy can be about 40 to 50 keV when using arsenic (As) as impurities. Even if the silicon oxide film 15 is thin as in this case, it has the effect of preventing the surface of the SOI layer 3 from being damaged by the implantation.

<B-2. Characteristic Functions and Effects>

As has been described so far, the silicon oxide film 15 for leaving the lightly-doped drain region 4 and the silicide protection film 17 are formed in separate process steps in the second preferred embodiment of the invention. However, since the surface of the SOI layer 3 is subjected to etching only once, the surface of the SOI layer 3 is removed by overetching in a reduced number of times. This prevents the thickness of the SOI layer 3 from being excessively reduced, thus reducing the possibility that the SOI layer 3 all becomes a silicide film in the silicide process. Accordingly, the silicide film 12 is prevented from exfoliate to form conductive dust, thus preventing deterioration of the operating characteristics of the semiconductor device due to the presence of the conductive dust, and also preventing deterioration of functions as a semiconductor device caused by exfoliation of the silicide film 12. Applying the source/drain implantation through the silicon oxide film 15 prevents the surface of the SOI layer 3 from being damaged by the implantation.

Since the silicon oxide film 15 for leaving the lightly-doped drain region 4 and the silicide protection film 17 are formed in separated process steps, this method is suitable for processes in which the two films are required to have different thicknesses. For example, it is necessary to adjust the length of the lightly-doped drain region 4 in the plane direction for the purpose of adjusting electric characteristics of the MOS transistor, such as the source/drain breakdown voltage. Obtaining a desired length requires that the silicon oxide film 15 has a thickness smaller than the thickness required for the silicide protection film 17. The present invention is suitable for such a case.

In the case where the source/drain implantation is performed after the formation of the sidewall oxide films 21 and 21A, the length of the lightly-doped drain region 4 in the plane direction can be adjusted by adjusting the thickness of the sidewall oxide films 21 and 21A.

<B-3. Modification>

The second preferred embodiment of the present invention described above has shown an example in which the resist mask R2 is selectively formed on a certain part of the silicon oxide film 16 in the protection region PR in the process step shown in FIG. 11 and then the silicon oxide film 16 is removed except in the part covered by the resist mask R2 by a dry etching in the process step shown in FIG. 12. However, in view of preventing overetching to the surface of the SOI layer 3, the following method can be used.

Figure 14:
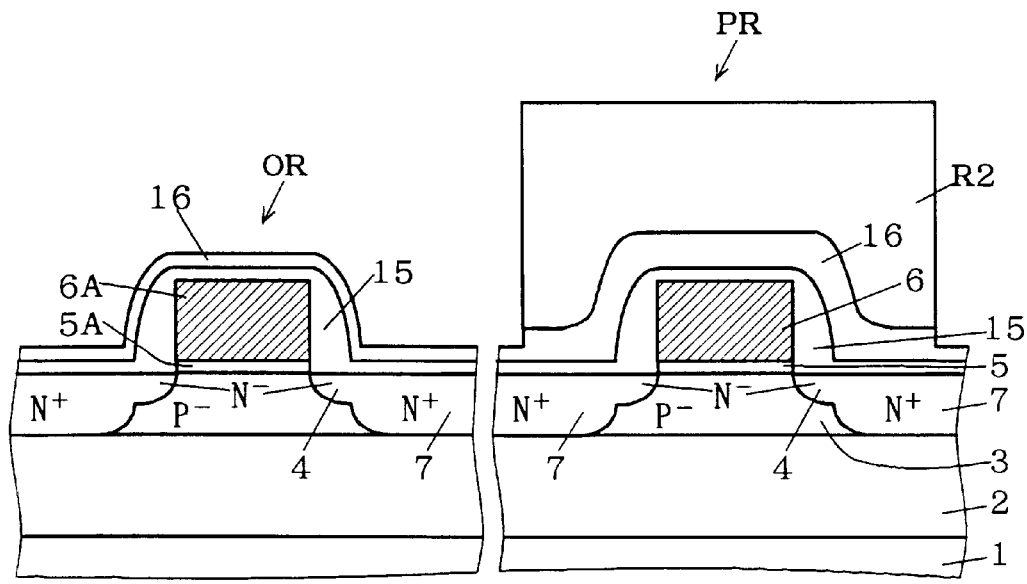
FIGS. 14 and 15 are diagrams showing a modification of the semiconductor device fabrication method according to the second preferred embodiment of the present invention.

That is to say, following the process step shown in FIG. 11, the silicon oxide film 16 is removed to a certain thickness except in the part covered by the resist mask R2 by a dry etching as shown in FIG. 14. In this case, the thickness of the silicon oxide film 16 is set to be about 200 Å on the silicon oxide film 15.

Figure 15:
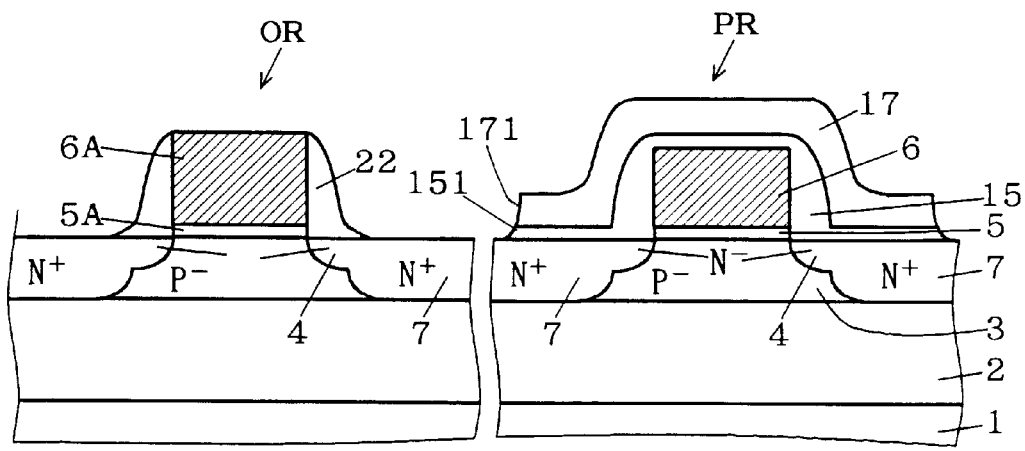
Figure 16:
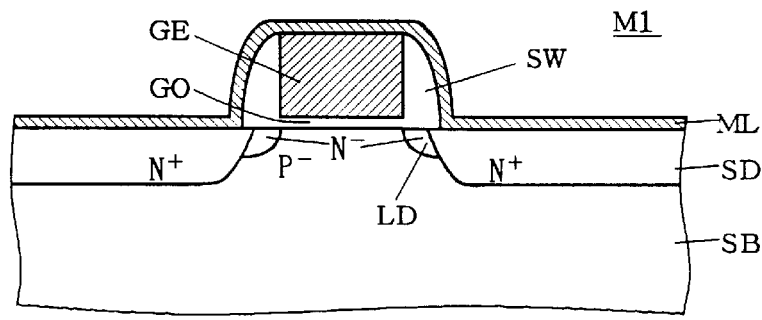
FIGS. 16 and 17 are diagrams illustrating the salicide process in fabrication of an MOS transistor.
Figure 17:
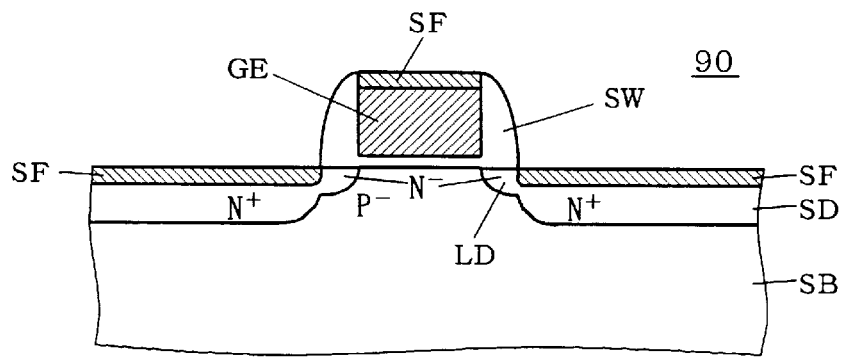
Figure 18:
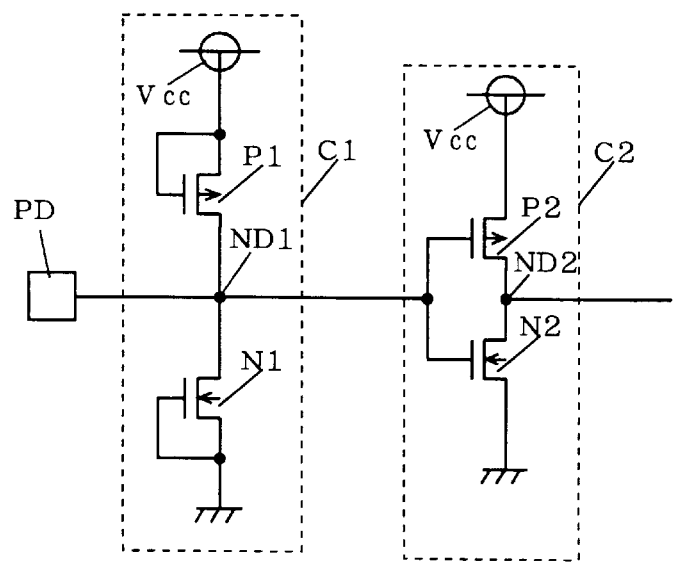
FIG. 18 is a diagram for explaining a use of the silicide protection film.
Figure 19:
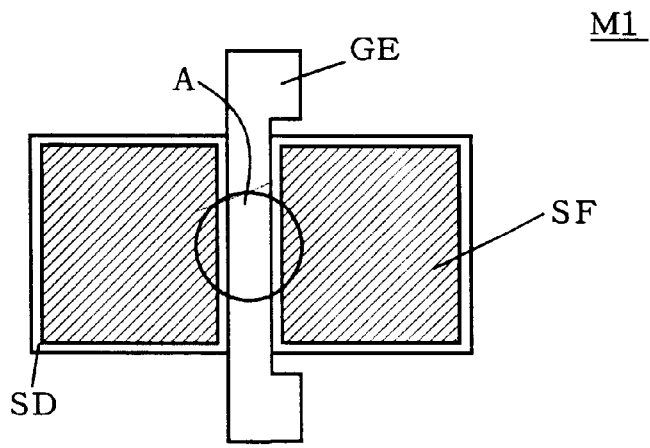
FIGS. 19 and 20 are diagrams for describing a problem of the silicide film.
Figure 20:
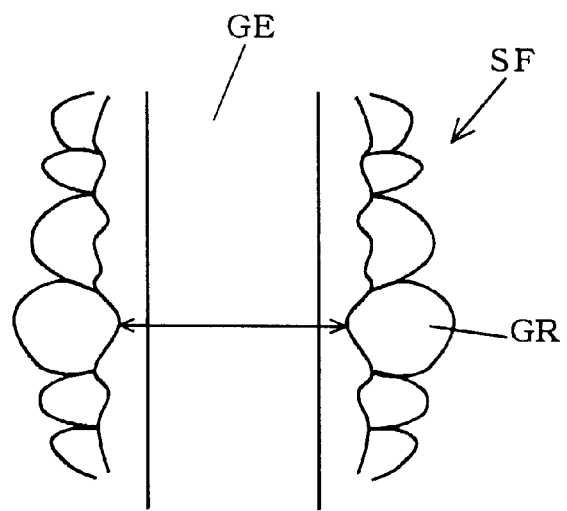
Figure 21:
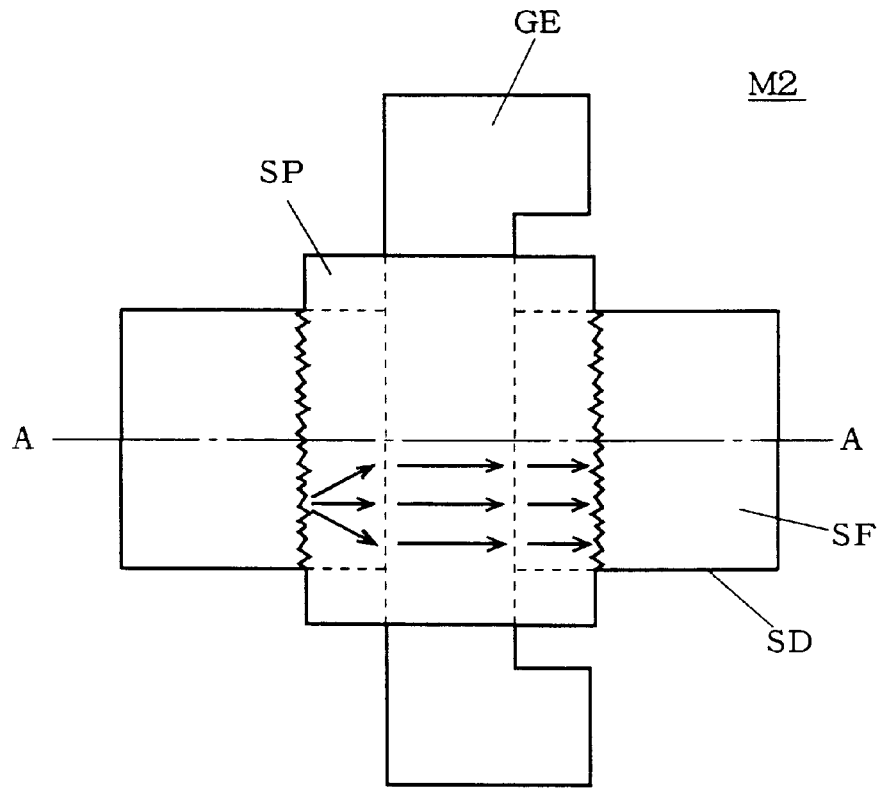
FIGS. 21 and 22 are plane views for describing operation of the silicide protection film.
Figure 22:
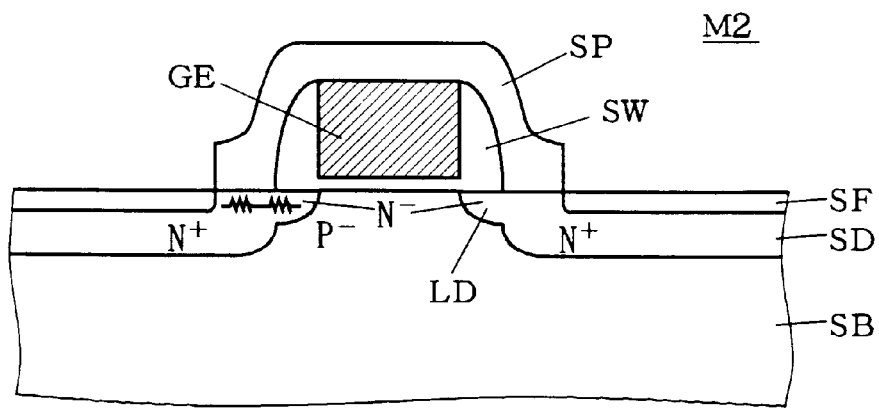
Figure 23:
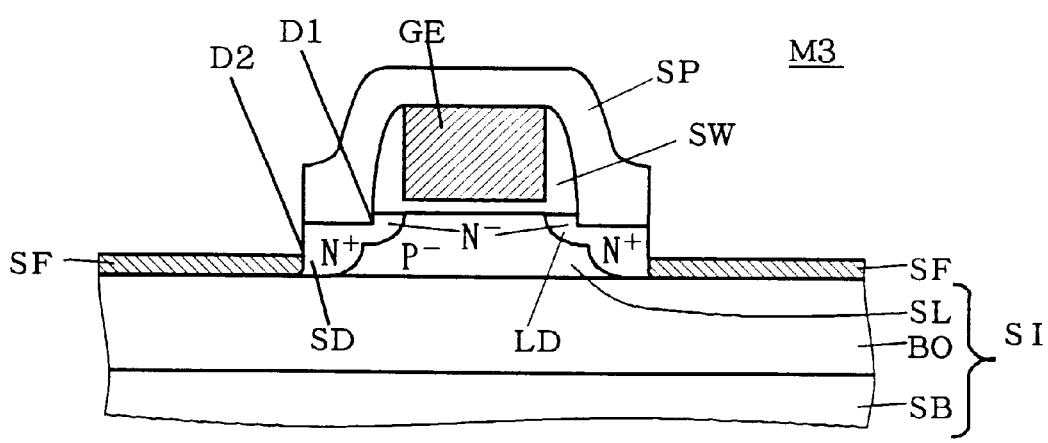
FIG. 23 is a diagram illustrating a problem of the silicide protection film.

Next, in the process step shown in FIG. 15, the silicon oxide films 16 and 15 are completely removed by wet etching. Since the wet etching has a high selectivity ratio with respect to silicon, the rate of overetch to the surface of the SOI layer 3 is small, which further prevents the excessive reduction in the thickness of the SOI layer 3. This further reduces the possibility that the SOI layer 3 all becomes a silicide film in the silicide process.

Since wet etching is isotropic, the part uncovered by the resist mask R2, or the edge portion 171 of the silicide protection film 17 and the edge portion 151 of the silicon oxide film 15 are somewhat removed and therefore the surfaces of the edge portions 171 and 151 are gradually sloped in the vertical section direction. The same is true for the surface form of the sidewall oxide film 22 in the MOS transistor in the ordinary region OR. This can be said to be a feature of an application of this modification.

The above-described first and second preferred embodiments of the present invention have only shown examples of formation of MOS transistors on an SOI substrate. However, needless to say, the present invention can also be applied to formation of MOS transistors on a bulk silicon substrate.

While the invention has been described in detail, the foregoing description is in all aspects illustrative and not restrictive. It is understood that numerous other modifications and variations can be devised without departing from the scope of the invention.

I claim:

1. A method for fabricating a semiconductor device comprising first and second MOS transistors formed on a semiconductor substrate, with a silicide protection film formed in a part where formation of a silicide film is not desirable in said first MOS transistor, the method comprising the steps of:

(a) forming a first gate oxide film and a first gate electrode one on top of the other in this order in a region in which said first MOS transistor is formed on a main surface of said semiconductor substrate and a second gate oxide film and a second gate electrode one on top of the other in this order in a region in which said second MOS transistor is formed;

(b) implanting impurity ions of a first conductivity type into said semiconductor substrate by using said first and second gate electrodes as masks to form a first semiconductor region of the first conductivity type at a relatively low concentration in a self-aligned manner in the surface of said semiconductor substrate on the outside of side surfaces of said first and second gate electrodes;

(c) forming an oxide film to cover said first and second gate electrodes and the surface of said semiconductor substrate;

(d) implanting impurity ions of the first conductivity type from above said oxide film by using said first and second gate electrodes and said oxide film formed on the side surfaces of said first and second gate electrodes as masks to form a second semiconductor region of the first conductivity type at a relatively high concentration in a self-aligned manner in the surface of said semiconductor substrate including said first semiconductor region;

(e) selectively forming a resist mask extending from the top of said first gate electrode to the top of said oxide film of the outer vicinity of the side surface of said first gate electrode; and (f) etching said oxide film uncovered by said resist mask such that said oxide film under said resist mask is left as said silicide protection film and that said oxide film on the side surfaces of said second gate electrode and said second gate oxide film is left as a sidewall oxide film.

2. The semiconductor device fabrication method according to claim 1, wherein said step (f) comprises the steps of, (f-1) thinning the thickness of said oxide film uncovered by said resist mask by anisotropic dry etching, and (f-2) removing said thinned oxide film by wet etching.

3. The semiconductor device fabrication method according to claim 1, wherein said semiconductor substrate is an SOI substrate comprising an SOI layer formed on an insulating substrate.

4. A method for fabricating a semiconductor device having first and second MOS transistors formed on a semiconductor substrate with a silicide protection film formed in a part where formation of a silicide film is undesirable in said first MOS transistor, comprising the steps of:

(a) forming a first gate oxide film and a first gate electrode one on top of the other in this order in a region in which said first MOS transistor is formed on a main surface of said semiconductor substrate and a second gate oxide film and a second gate electrode one on top of the other in this order in a region in which said second MOS transistor is formed;

(b) implanting impurity ions of a first conductivity type into said semiconductor substrate by using said first and second gate electrodes as masks to form a first semiconductor region of the first conductivity type at a relatively low concentration in a self-aligned manner in the surface of said semiconductor substrate on the outside of side surfaces of said first and second gate electrodes;

(c) forming a first oxide film to cover said first and second gate electrodes and the surface of said semiconductor substrate;

(d) thinning the thickness of said first oxide film by anisotropic dry etching to form a first sidewall oxide film on the side surfaces of said first gate electrode and said first gate oxide film and to form a second sidewall oxide film on the side surfaces of said second gate electrode and said second gate oxide film;

(e) before or after said step (d), implanting impurity ions of the first conductivity type from above said first oxide film to form a second semiconductor region of the first conductivity type at a relatively high concentration in a self-aligned manner in the surface of said semiconductor substrate including said first semiconductor region;

(f) forming a second oxide film on thinned said first oxide film;

(g) selectively forming a resist mask extending from the top of said first gate electrode to the top of said second oxide film of the outer vicinity of the side surface of said first gate electrode; and (h) removing said second oxide film uncovered by said resist mask and said thinned first oxide film under said second oxide film by etching and making said second oxide film under said resist mask said silicide protection film.

5. The semiconductor device fabrication method according to claim 4, wherein said step (e) is performed prior to said step (d), and said step (e) comprises the step of implanting impurity ions of the first conductivity type by using said first and second gate electrodes and said first oxide film formed on the side surfaces of said first and second gate electrodes as masks.

6. The semiconductor device fabrication method according to claim 4, wherein said step (e) is performed after said step (d), and said step (e) comprises the step of implanting impurity ions of the first conductivity type by using said first and second gate electrodes and said first and second sidewall oxide films as masks.

7. The semiconductor device fabrication method according to claim 4, wherein said step (h) comprises the steps of, (h-1) thinning the thickness of said second oxide film at least in the part uncovered by said resist mask by anisotropic dry etching, and (h-2) removing thinned said second oxide film and thinned said first oxide film under said second oxide film by wet etching.

8. The semiconductor device fabrication method according to claim 4, wherein said semiconductor substrate is an SOI substrate comprising an SOI layer formed on an insulating substrate.

9. A method for fabricating a semiconductor device comprising first and second MOS transistors formed on a semiconductor substrate, with a silicide protection film formed in a part where formation of a silicide film is not desirable in said first MOS transistor, the method comprising the steps of:

(a) forming a first gate oxide film and a first gate electrode one on top of the other in this order in a region in which said first MOS transistor is formed on a main surface of said semiconductor substrate and a second gate oxide film and a second gate electrode one on top of the other in this order in a region in which said second MOS transistor is formed;

(b) implanting impurity ions of a first conductivity type into said semiconductor substrate by using said first and second gate electrodes as masks to form a first semiconductor region to the first conductivity type at a relatively low concentration in a self- aligned manner in the surface of said semiconductor substrate on the outside of side surfaces of said first and second gate electrodes;

(c) forming an insulating film to cover said first and second gate electrodes and the surface of said semiconductor substrate;

(d) implanting impurity ions of the first conductivity type from above said insulating film by using said first and second gate electrodes and said insulating film formed on the side surfaces of said first and second gate electrodes as masks to form a second semiconductor region of the first conductivity type at a relatively high concentration in a self-aligned manner in the surface of said semiconductor substrate including said first semiconductor region;

(e) selectively forming a resist mask extending from the top of said first gate electrode to the top of said insulating film of the outer vicinity of the side surface of said of said first gate electrode; and (f) etching said insulating film uncovered by said resist mask such that said insulating film under said resist mask is left as said silicide protection film and that said insulating film on the side surfaces of said second gate electrode and said second gate oxide film is left as a sidewall insulating film.

10. The semiconductor device fabrication method according to claim 1, wherein said step (f) comprises the steps of, (f-1) thinning the thickness of said insulating film uncovered by said resist mask by anisotropic dry etching, and (f-2) removing said thinned insulating film by wet etching.

11. The semiconductor device fabrication method according to claim 1, wherein said semiconductor substrate is an SOI substrate comprising an SOI layer formed on an insulating substrate.

12. A method for fabricating a semiconductor device having first and second MOS transistors formed on a semiconductor substrate with a silicide protection film formed in a part where formation of a silicide film is undesirable in said first MOS transistor, comprising the steps of:

(a) forming a first gate oxide film and a first gate electrode one on top of the other in this order in a region in which said first MOS transistor is formed on a main surface of said semiconductor substrate and a second gate oxide film and a second MOS transistor is formed;

(b) implanting impurity ions of a first conductivity type into said semiconductor substrate by using said first and second gate electrodes as masks to form a first semiconductor region of the first conductivity type at a relatively low concentration in a self- aligned manner in the surface of said semiconductor substrate on the outside of side surfaces of said first and second gate electrodes;

(c) forming a first insulating film to cover said first and second gate electrodes and the surface of said semiconductor substrate;

(d) thinning the thickness of said first insulating film by anisotropic dry etching to from a first sidewall insulating film on the side surfaces of said first gate electrode and said first gate oxide film and to form a second sidewall insulating film on the side surfaces of said second gate electrode and said second gate oxide film;

(e) before of after said step (d), implanting impurity ions of the first conductivity type from above said first insulating film to form a second semiconductor region of the first conductivity type at a relatively high concentration in a self-aligned manner in the surface of said semiconductor substrate including said first semiconductor region;

(f) forming a second insulating film on thinned said first insulating film;

(g) selectively forming a resist mask extending from the top of said gate electrode to the top of said second insulating film of the outer vicinity of the side surface of said first gate electrode; and (h) removing said second insulating film uncovered by said resist mask and said thinned first insulating film under said second insulating film by etching and making said second insulating film under said resist mask said silicide protection film.

13. The semiconductor device fabrication method according to claim 4, wherein said step (e) is performed prior to said step (d), and said step (e) comprises the step of implanting impurity ions of the first conductivity type by using said first and second gate electrodes and said first insulating film formed on the side surfaces of said first and second gate electrodes as masks.

14. The semiconductor device fabrication method according to claim 4, wherein said step (e) is performed after said step (d), and said step (e) comprises the step of implanting impurity ions of the first conductivity type by using said first and second gate electrodes and said first and second sidewall insulating films as mask.

15. The semiconductor device fabrication method according to claim 4, wherein said step (h) comprises the steps of, (h-1) thinning the thickness of said second insulating film at least in the part uncovered by said resist mask by anisotropic dry etching, and (h-2) removing thinned said second insulating film and thinned said first insulating film under said second insulating film by wet etching.

16. The semiconductor device fabrication method according to claim 4, wherein said semiconductor substrate is an SOI substrate comprising an SOI layer formed on an insulating substrate.

* * * * *